(12) United States Patent
Ahn

(10) Patent No.: US 11,551,732 B2
(45) Date of Patent: Jan. 10, 2023

(54) SEMICONDUCTOR DEVICE FOR SETTING OPTIONS OF I/O INTERFACE CIRCUITS

(71) Applicants: SK hynix Inc., Gyeonggi-do (KR); ONE Semiconductor Corporation, Gyeonggi-do (KR)

(72) Inventor: Jin Hong Ahn, Gyeonggi-do (KR)

(73) Assignees: SK hynix Inc., Gyeonggi-do (KR); ONE Semiconductor Corporation, Gyeonggi-do (KR)

(*) Notice: Subject to any disclaimer, the term of this patent is extended or adjusted under 35 U.S.C. 154(b) by 0 days.

(21) Appl. No.: 17/346,708

(22) Filed: Jun. 14, 2021

(65) Prior Publication Data

US 2022/0208236 A1 Jun. 30, 2022

(30) Foreign Application Priority Data

Dec. 29, 2020 (KR) .......................... 10-2020-0185725

(51) Int. Cl.
*G11C 7/10* (2006.01)
*G11C 29/36* (2006.01)
*G11C 29/12* (2006.01)
*H03K 19/173* (2006.01)

(52) U.S. Cl.
CPC ............ *G11C 7/1057* (2013.01); *G11C 7/103* (2013.01); *G11C 7/106* (2013.01); *G11C 7/1084* (2013.01); *G11C 7/1087* (2013.01); *G11C 29/12015* (2013.01); *G11C 29/36* (2013.01); *H03K 19/1737* (2013.01); *G11C 2029/3602* (2013.01)

(58) Field of Classification Search
CPC ....... G11C 7/1057; G11C 7/103; G11C 7/106; G11C 7/1084; G11C 7/1087; G11C 29/12015; G11C 29/36; G11C 2029/3602
See application file for complete search history.

(56) References Cited

U.S. PATENT DOCUMENTS

| 7,519,766 B2 * | 4/2009 | Schafer ................ G11C 7/1027 711/104 |
| 7,707,467 B2 | 4/2010 | Louie et al. |
| 8,344,769 B2 * | 1/2013 | Adachi ................... H03L 7/093 327/147 |

(Continued)

FOREIGN PATENT DOCUMENTS

| KR | 10-0727975 | 6/2007 |
| KR | 10-0727976 | 6/2007 |
| KR | 10-2015-0097074 | 8/2015 |

OTHER PUBLICATIONS

Kim et al., 45-Gb/s SiGe BiCMOS PRBS Generator and PRBS Checker, IEEE 2003 Custom Integrated Circuits Conference, 2003, p. 313-p. 316, IEEE, San Jose, CA, USA.

(Continued)

*Primary Examiner* — Vanthu T Nguyen
(74) *Attorney, Agent, or Firm* — IP & T Group LLP

(57) ABSTRACT

A semiconductor device includes a plurality of input/output (I/O) pads; a serial input pad; a serial output pad; a plurality of interface circuits respectively corresponding to the I/O pads; and a plurality of option setting circuits respectively corresponding to the interface circuits, suitable for setting options of the respective interface circuits, wherein the serial input pad, the interface circuits, the option setting circuits, and the serial output pad configure a serial chain.

21 Claims, 10 Drawing Sheets

(56) References Cited

U.S. PATENT DOCUMENTS

| | | | |
|---|---|---|---|
| 8,645,777 B2* | 2/2014 | Zimmerman | G11C 29/32 |
| | | | 714/724 |
| 9,476,940 B2* | 10/2016 | Zimmerman | G01R 31/318513 |
| 2005/0135168 A1* | 6/2005 | Kim | G11C 7/1078 |
| | | | 365/201 |
| 2011/0179325 A1 | 7/2011 | Gupta et al. | |

OTHER PUBLICATIONS

Yoo et al., A 256-stage UART Programmable Arbitrary Digital Signal Generator for RFID Reader Applications, The 23rd Korean Conference on Semiconductors(KCS 2016), 2016.

Aydiner et al., Modeling of DDR5 Signaling from Jitter Sequences to Accurate Bit Error Rate (BER), 2017 IEEE 26th Conference on Electrical Performance of Electronic Packaging and Systems (EPEPS), 2017, IEEE, San Jose, CA, USA.

Chen et al., Verilog—A Compatible Recurrent Neural Network Model for Transient Circuit Simulation, 2017 IEEE 26th Conference on Electrical Performance of Electronic Packaging and Systems (EPEPS), 2017, IEEE, San Jose, CA, USA.

Lu et al., High-Speed Channel Modeling with Deep Neural Network for Signal Integrity Analysis, 2017 IEEE 26th Conference on Electrical Performance of Electronic Packaging and Systems (EPEPS), 2017, IEEE, San Jose, CA, USA.

\* cited by examiner

SEMICONDUCTOR DEVICE FOR SETTING OPTIONS OF I/O INTERFACE CIRCUITS

CROSS-REFERENCE TO RELATED APPLICATION

The present application claims priority of Korean Patent Application No. 10-2020-0185725, filed on Dec. 29, 2020, which is herein incorporated by reference in its entirety.

BACKGROUND

1. Field

The disclosure relates to semiconductor design technology, and more particularly, to a method for setting options of input/output (I/O) interface circuits of a semiconductor device.

2. Description of the Related Art

The history of acceleration of memory products such as a double data rate (DDR) synchronous dynamic random memory (SDRAM) shows that benefits from upgraded product standards have played an important role in addition to continuous process and improvement in design technology. For example, DDR4 SDRAM has achieved up to 3200 Mbps due to standardization such as timing training or level calibration, performed by a host or a controller.

Meanwhile, DDR5 SDRAM aims to achieve a speed between 6400 Mbps and 4400 Mbps, but still maintains a single-ended wide parallel interface. It is difficult to expect gains by distinct standards to compensate for increased data bandwidth except for 4-tap decision-based equalization (DFE) technology. Therefore, basic design performance improvements such as improved jitter or duty cycle, and reduced voltage fluctuations are difficult to implement after DDR5 SDRAM, and eventually the number of cases where specifications are met should be tested by employing a plurality of options for parameters involved in an I/O interface circuit. However, it is expected that it will be difficult to cover all of these options with the DDR5 SDRAM standardization currently underway at JEDEC. For example, the 4-tap DFE technology, presented as a major benefit of DDR5 SDRAM, implies many options in itself, and the application method and effectiveness may vary widely depending on the application environment.

It is possible to evaluate the options for parameters involved in the I/O interface circuit with complex operation mechanisms by simulating them. However, when applying such simulated options for parameters involved in the I/O interface circuit to a real circuit, the simulated options are not only inaccurate, but the simulated options also require a long design period, so the options for the I/O interface circuit may result in enlarging the minimum/maximum margins. However, the options with enlarged margins result in an increase in chip size and the cost of testing is increased because testing of all combinations is required if the interconnection of options is not known.

SUMMARY

Various embodiments are directed to a semiconductor device capable of setting options for parameters related to I/O interface characteristics in an ultrahigh-speed memory device, using a serial chain. Further, various embodiments are directed to a semiconductor device capable of verifying the I/O interface characteristics by outputting and monitoring the set options using the serial chain.

Various embodiments are directed to a semiconductor device capable of measuring a bit error rate (BER) without using a separate test device. Further, various embodiments are directed to a semiconductor device capable of outputting and monitoring the measured result using the serial chain.

According to an embodiment, a semiconductor device includes a plurality of input/output (I/O) pads; a serial input pad; a serial output pad; a plurality of interface circuits respectively corresponding to the I/O pads; and a plurality of option setting circuits respectively corresponding to the interface circuits, suitable for setting options of the respective interface circuits, wherein the serial input pad, the interface circuits, the option setting circuits, and the serial output pad configure a serial chain.

According to an embodiment, a semiconductor device includes a plurality of input/output (I/O) pads; a serial input pad; a serial output pad; a pattern generating circuit suitable for generating a test pattern according to a dock signal; a plurality of input buffers and a plurality of output buffers respectively corresponding to the I/O pads; a plurality of path control circuits respectively corresponding to the I/O pads, suitable for outputting the test pattern to the output buffers during a read operation, and for generating a plurality of comparison signals by comparing the test pattern with data inputted from the I/O pads during a write operation; and a plurality of option setting circuits respectively corresponding to the input buffers, the output buffers, and the path control circuits, to set options thereof, wherein the serial input pad, the option setting circuits, and the serial output pad configure a serial chain.

According to an embodiment, a semiconductor system includes a first semiconductor device including a plurality of input/output (I/O) pads, a serial input pad and a serial output pad; and a second semiconductor device suitable for sequentially transferring option information to the first semiconductor device through the serial input pad, and for monitoring set option information that are provided from the first semiconductor device through the serial output pad, wherein the first semiconductor device includes: a plurality of interface circuits respectively corresponding to the I/O pads; and a plurality of option setting circuits respectively corresponding to the interface circuits, suitable for setting options of the respective interface circuits, wherein the serial input pad, the interface circuits, the option setting circuits, and the serial output pad configure a serial chain.

According to an embodiment, a semiconductor device includes a serial input pad; a serial output pad; a plurality of data pads in parallel; a plurality of interface circuits respectively corresponding to the data pads and coupled in parallel between the serial input pad and the serial output pad, each interface circuit including an input buffer and an output buffer which are coupled to a corresponding data pad among the data pads; an internal circuit including a plurality of memory cells; a plurality of path control circuits respectively corresponding to the interface circuits and coupled in parallel between the internal circuit and the interface circuits; and a plurality of option setting circuits respectively corresponding to the interface circuits, suitable for setting options of the respective interface circuits and the respective path control circuits, each option setting circuit coupled between the serial input pad and a corresponding interface circuit, between the corresponding interface circuit and an adjacent interface circuit to the corresponding interface circuit or between the corresponding interface circuit and the serial output pad, wherein the serial input pad, the interface circuits, the option setting circuits, and the serial output pad configure a serial chain.

According to the embodiments, the semiconductor device may set the options for parameters related to the I/O interface characteristics by using a serial chain, without receiving an address and/or a command, thereby achieving a high-speed operation. Further, the semiconductor device may measure the BER without using a separate test device, thereby minimizing the cost and time of the testing.

DETAILED DESCRIPTION

Figure 1:
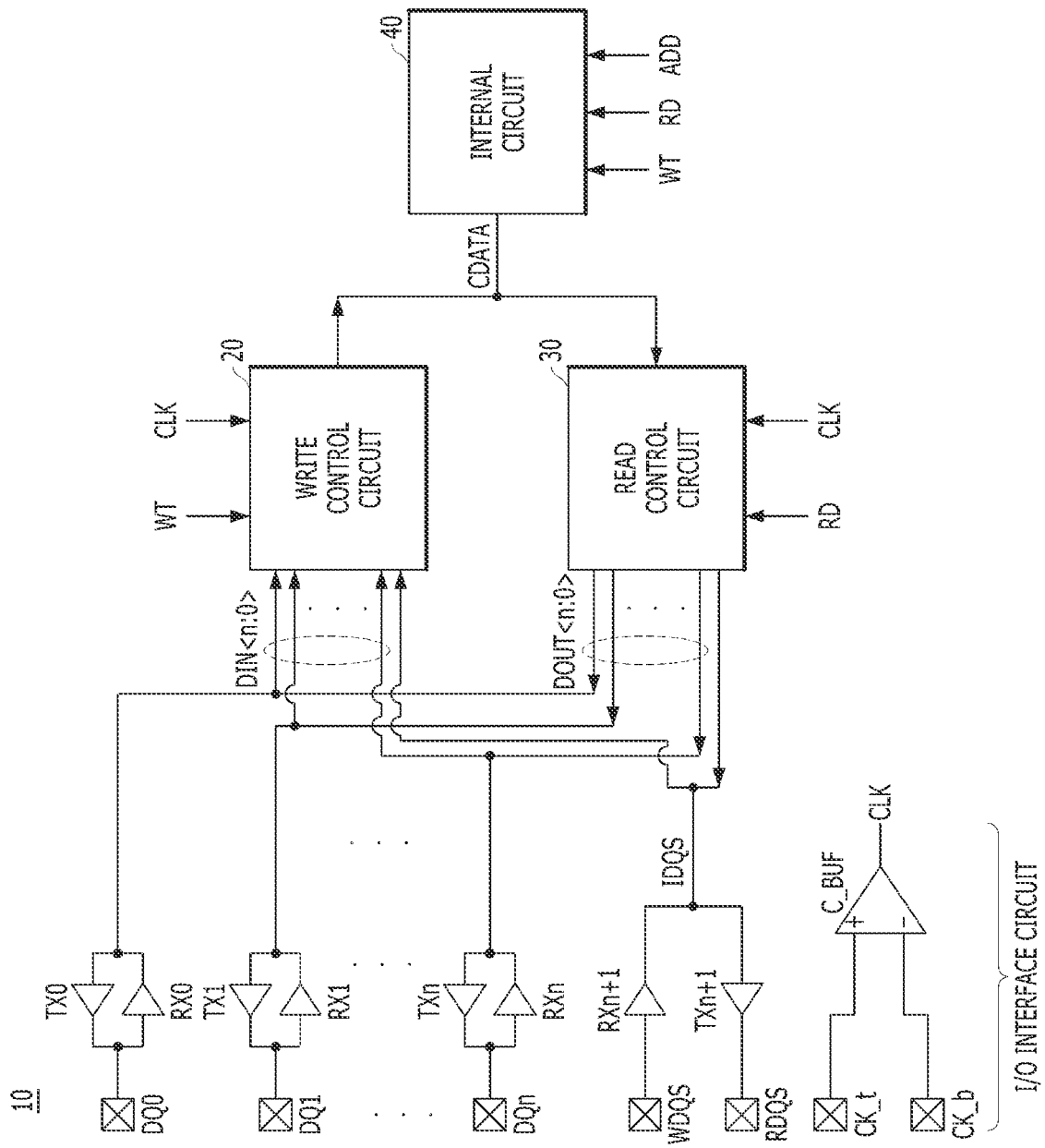
FIG. 1 is a configuration diagram illustrating a semiconductor device.

Various embodiments are described below with reference to the accompanying drawings. The embodiments may, however, be embodied in different forms and thus should not be construed as limited to the embodiments set forth herein. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s), The term "embodiments" when used herein does not necessarily refer to all embodiments.

It will be understood that, although the terms "first", "second", "third" and so on may be used herein to identify various elements, these elements are not limited by these terms. These terms are used to distinguish one element from another element that otherwise have the same or similar names. Thus, a first element in one instance could also be termed a second or third element in another instance without indicating any change in the element itself.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context dearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, in embodiments of the present invention a semiconductor, a semiconductor device will be described as a synchronous memory device. However, the invention is not limited to this and can be applied to a semiconductor device containing a number of pads and an I/O interface circuit to interface them.

FIG. 1 is a configuration diagram illustrating a semiconductor device 10.

Referring to FIG. 1, the semiconductor device 10 may include a plurality of data pads DQ0 to DQn, a write strobe pad WDQS, a read strobe pad RDQS, a plurality of differential dock pads CK_t and CK_b, a plurality of input buffers RX0 to RXn+1, a plurality of output buffers TX0 to TXn+1, a dock buffer C_BUF, a write control circuit 20, a read control circuit 30, and an internal circuit 40. The semiconductor device 10 shown in FIG. 1 may include a synchronous memory device which operates in synchronization with a strobe signal. Meanwhile, the semiconductor device 10 may further include address/command pads, a command decoder for decoding address/command signals inputted through the address/command pads, and so on.

The input buffers RX0 to RXn and the output buffers TX0 to TXn may correspond to the data pads DQ0 to DQn, respectively. The input buffers RX0 to RXn may transfer write data DIN<n:0> which are provided from an external device (e.g., a controller or a test device) through the data pads DQ0 to DQn, to the write control circuit 20, during a write operation. The output buffers TX0 to TXn may output read data DOUT<n:0> which are provided from the read control circuit 30, to the externa device through the data pads DQ0 to DQn, during a read operation.

The input buffer RXn+1 and the output buffer TXn+1 may correspond to the write strobe pad WDQS and the read strobe pad RDQS, respectively. The input buffer RXn+1 may transfer a strobe signal IDQS that is inputted from the externa device through the write strobe pad WDQS, to the write control circuit 20, during the write operation. The output buffer TXn+1 may output the strobe signal IDQS that is provided from the read control circuit 30, to the externa device through the read strobe pad RDQS, during the read operation, Although FIG. 1 shows that each of the write strobe pad WDQS and the read strobe pad RDQS is composed of a single pad, the present invention is not limited thereto. Each of the write strobe pad WDQS and the read strobe pad RDQS may include a pair of pads for receiving or outputting differential signals.

The dock buffer C_BUF may generate an internal clock signal CLK by receiving differential clock signals inputted through the differential clock pads CK_t and CK_b.

The write control circuit 20 may control the writing of the write data DIN<n:0> to the internal circuit 40 according to the strobe signal IDQS inputted from the write strobe pad WDQS when a write command WT is inputted during the write operation. The write control circuit 20 may output cell data CDATA by deserializing the write data DIN<n:0> according to the strobe signal IDQS.

The read control circuit 30 may generate the strobe signal IDQS according to the internal clock signal CLK, and output the cell data CDATA provided from the internal circuit 40 as the read data DOUT<n:0> together with the strobe signal IDQS, when a read command RD is inputted during the read operation. The strobe signal IDQS generated during the read operation may be provided to the external device through the read strobe pad RDQS. The read control circuit 30 may serialize the read data DOUT<n:0> according to the internal dock signal CLK. The write control circuit 20 and the read control circuit 30 may operate in synchronization with the internal dock signal CLK. In one embodiment, there is a time difference (i.e., a preset delay time) between the internal dock signal CLK used in the write control circuit 20 and the internal dock signal CLK used in the read control circuit 30 and the internal circuit 40.

The internal circuit 40 may include a plurality of memory cells. The internal circuit 40 may store the cell data CDATA transferred from the write control circuit 20 to memory cells assigned by an address ADD, during the write operation. The internal circuit 40 may read out the cell data CDATA from the memory cells assigned by the address ADD to transfer the cell data CDATA as the read data DOUT<n:0> to the read control circuit 30, during the read operation.

Hereinafter, the write operation and the read operation of the semiconductor device 10 of FIG. 1 will be described.

First, during the write operation, the address ADD, the internal clock signal CLK, the write data DIN<n:0> and the strobe signal IDQS, 2.0 together with the write command WT, are inputted to the semiconductor device 10 from the external device, through the address pads, the differential clock pads CK_t and CK_b, the data pads DQ0 to DQn, and the write strobe pad WDQS. The write control circuit 20 latches the write data DIN<n:0> that are inputted in serial, in response to the strobe signal IDQS, and transfers the cell data CDATA to the internal circuit 40 by deserializing the latched write data in response to the internal dock signal CLK. The cell data CDATA transferred to the internal circuit 40 may be stored in the memory cells assigned by the address ADD.

During the read operation, the address ADD and the internal dock signal CLK, together with the read command RD, are inputted to the semiconductor device 10 from the external device, through the address pads and the differential dock pads CK_t and CK_b. The internal circuit 40 reads out and transfers the cell data CDATA from the memory cells assigned by the address ADD to the read control circuit 30. The read control circuit 30 receives the cell data CDATA to output the read data DOUT<n:0> to the external device through the data pads DQ0 to DQn by serializing the read data DOUT<n:0> in response to the internal dock signal CLK. The read control circuit 30 generates the strobe signal IDQS in response to the internal clock signal CLK, and outputs it to the external device through the read strobe pad RDQS.

Meanwhile, among configurations of FIG. 1, the input buffers RX0 to RXn+1, the output buffers TX0 to TXn+1, and the clock buffer C_BUF, for interfacing input/output (I/O) signals through the data pads DQ0 to DQn, the write strobe pad WDQS, the read strobe pad RDQS, and the differential clock pads CK_t and CK_b, may be defined as I/O interface circuits. The semiconductor device 10 may further include an option setting circuit for setting options for parameters related to I/O interface characteristics, in addition to the I/O interface circuits.

Figure 2:
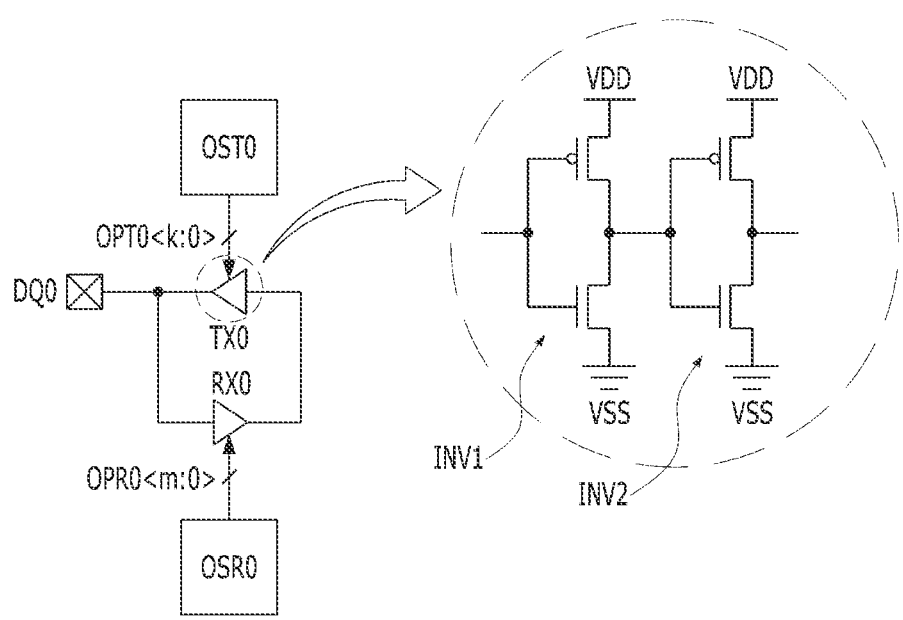
FIG. 2 is a configuration diagram illustrating I/O interface circuits and option setting circuits of a semiconductor device.

FIG. 2 is a configuration diagram illustrating I/O interface circuits TX0 and RX0, and option setting circuits OST0 and OSR0 of a semiconductor device.

Referring to FIG. 2, the I/O interface circuits may include an input buffer RX0 and an output buffer TX0, coupled to the first data pad DQ0, Each of the input buffer RX0 and the output buffer TX0 may include an even number (e.g., two) of inverters INV1 and INV2 coupled in series, Each of the input buffer RX0 and the output buffer TX0 may include a PMOS transistor and an NMOS transistor coupled between a source voltage (VDD) terminal and a ground voltage (VSS) terminal.

The option setting circuits OST0 and OSR0 may include a first option setting part OST0 for setting options of configurations (i.e., the PMOS transistor and the NMOS transistor) of the output buffer TX0, and a second option setting part OSR0 for setting options of configurations (i.e., the PMOS transistor and the NMOS transistor) of the input buffer RX0. For example, the options for setting the characteristics of the transistors may include a ratio of width to length (W/L) of the transistor, the drivability ratio of PMOS to NMOS transistor, a bias voltage, a gate capacitance, and so on. The first option setting part OST0 and the second option setting part OSR0 may respectively store option setting signals OPT0<k:0> and OPR0<m:0> for setting the respective options of the output buffer TX0 and the input buffer RX0, and provide the stored options to the output buffer TX0 and the input buffer RX0, respectively.

Generally, when a predetermined mode command (e.g., mode register set (MRS) command) and an address are inputted, the semiconductor device may read out an MRS code stored in an MRS, and set the option setting signals OPT0<k:0> and OPR0<m:0> of the first option setting part OST0 and the second option setting part OSR0 by using the MRS code. That is, the option setting circuits OST0 and OSR0 may set or change the option setting signals OPT0<k:0> and OPR0<m:0> stored therein, respectively, depending on the MRS code. However, this approach has a limitation to provide the options for the parameters related to the I/O interface characteristics, and a substantial amount of time is needed to change the options since the MRS command and the address should be provided in each case. In particular, the test time and cost will be increased to ensure that the set options are properly reflected.

Hereinafter, a method of setting options for parameters related to I/O interface characteristics, and measuring the set options, using a serial chain, in accordance with an embodiment of the present invention will be described.

Figure 3:
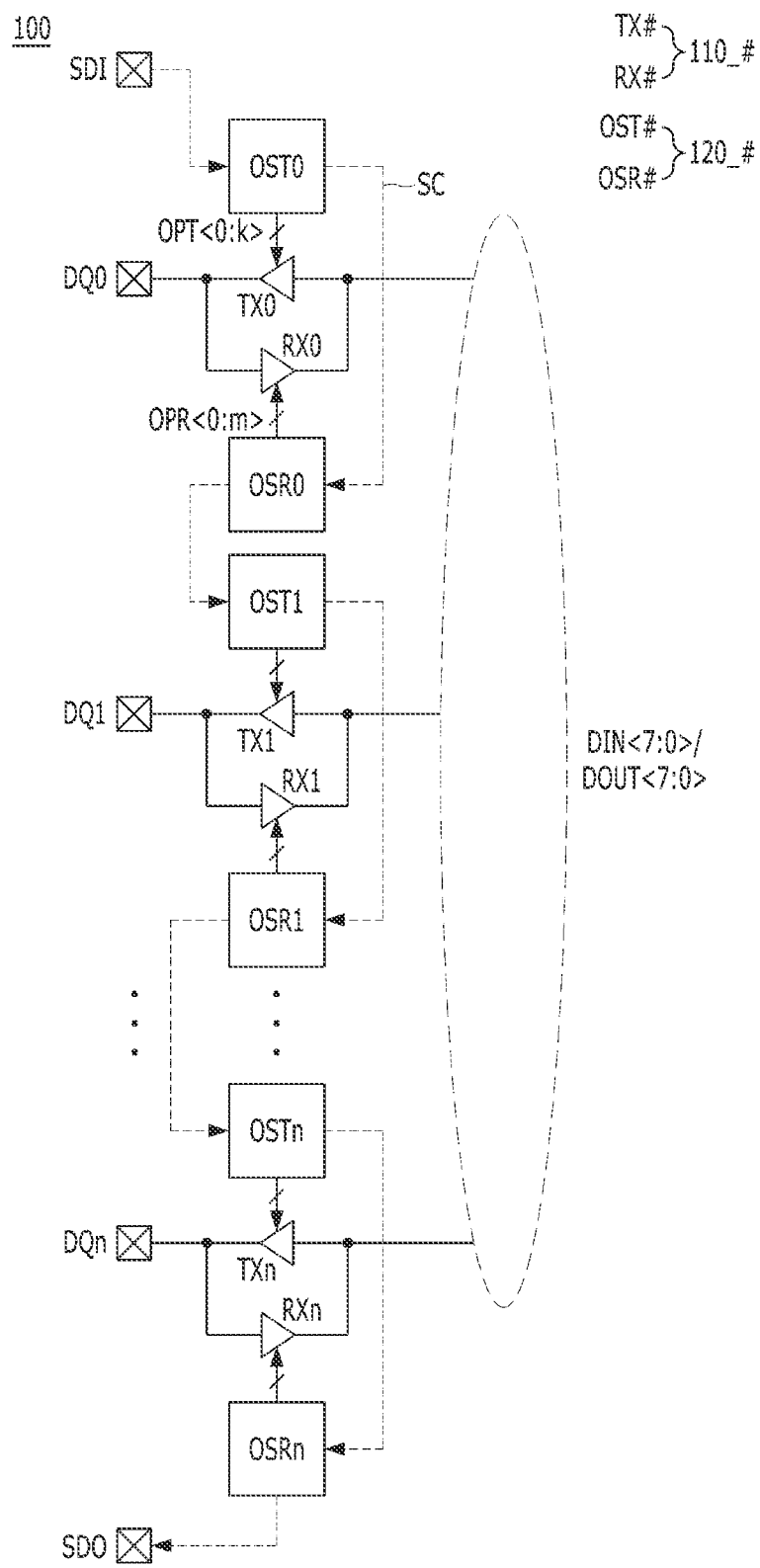
FIG. 3 is a configuration diagram illustrating a semiconductor device including option setting circuits in accordance with an embodiment of the present invention.

FIG. 3 is a configuration diagram illustrating a semiconductor device 100 including option setting circuits in accordance with an embodiment of the present invention.

Referring to FIG. 3, the semiconductor device 100 may include a plurality of data pads DQ0 to DQn, a serial input pad SDI, a serial output pad SDO, a plurality of interface circuits 110_0 to 110_*n*, and a plurality of option setting circuits 120_0 to 120_*n*. The interface circuits 110_0 to 110_*n* may respectively correspond to the data pads DQ0 to DQn, and include a plurality of output buffers TX0 to TXn and a plurality of input buffers RX0 to RXn. That is, each 110_# (where # is an integer from 0 to n) of the interface circuits 110_0 to 110_*n* may include an output buffer TX # for outputting data to a corresponding data pad DQ #, and an input buffer RX # for receiving data from the corresponding data pad DQ #. The option setting circuits 120_0 to 120_*n* may respectively correspond to the interface circuits 110_0 to 110_*n* to set options of the respective interface circuits 110_0 to 110_*n*. That is, each 120_# of the option setting circuits 120_0 to 120_*n* may include a first option setting part OST # for setting an option of a corresponding output buffer TX #, and a second option setting part OSR # for setting an option of a corresponding input buffer RX #. The data pads DQ0 to DQn may be input/output pads for receiving and outputting data/signals.

Meanwhile, the semiconductor device 100 may further include a write strobe pad WDQS, a read strobe pad RDQS, differential clock pads CK_t and CK_b, and a plurality of I/O interface circuits (i.e., input buffers and output buffers) corresponding thereto, as shown in FIG. 1. The semiconductor device 100 may further include address/command pads, a command decoder for decoding address/command signals inputted through the address/command pads, and so on.

The first option setting parts OST0 to OSTn may respectively correspond to the output buffers TX0 to TXn. Each of the first option setting parts OST0 to OSTn may provide a first option setting signal OPT k:0> for setting an option of a correspond output buffer. The second option setting parts OSR0 to OSRn may respectively correspond to the input buffers RX0 to RXn. Each of the second option setting parts OSR0 to OSRn may provide a second option setting signal OPR<m:0> for setting an option of a correspond input buffer. For reference, the first option setting signals OPT<k:0> outputted from the first option setting parts OST0 to OSTn, and the second option setting signals OPR<m:0> outputted from the second option setting parts OSR0 to OSRn may be distinct signals.

In an embodiment, the serial input pad SDI, the option setting circuits 120_0 to 120_*n*, and the serial output pad SDO may configure a serial chain SC. The serial chain SC may be configured between the serial input pad SDI and the serial output pad SDO, in a sequence from the first option setting part OST # to the second option setting part OSR # in each of the option setting circuits 120_0 to 120_*n*. For example, the serial chain SC may be formed in a sequence of the first option setting part OST0 corresponding to the first output buffer TX0, the second option setting part OSR0 corresponding to the first input buffer RX0, the first option setting part OST1 corresponding to the second output buffer TX1, the second option setting part OSR1 corresponding to the second input buffer RX1, the first option setting part OSTn corresponding to the (n+1)th output buffer TXn, and the second option setting part OSRn corresponding to the (n+1)th input buffer RXn. Depending on an embodiment, the serial chain SC may be configured between the serial input pad SDI and the serial output pad SDO, in a sequence from the second option setting part OSR # to the first option setting part OST # in each of the option setting circuits 120_0 to 120_*n*.

As described above, through the serial chain SC, a serial signal inputted through the serial input pad SDI may be sequentially stored in the first option setting parts OST0 to OSTn and the second option setting parts OSR0 to OSRn, so that the stored signal is used as values for setting the options of the input/output buffers. Further, the values stored in the first option setting parts OST0 to OSTn and the second option setting parts OSR0 to OSRn may be outputted in serial to the serial output pad SDO through the serial chain SC. Thus, an external device may check/verify whether the options are properly set, based on the serial signal outputted through the serial output pad SDO.

For reference, each of the input buffers RX0 to RXn and the output buffers TX0 to TXn may be configured to have an even number (e.g., two) of inverters INV1 and INV2 coupled in series, as shown in FIG. 2, Each of the inverters INV1 and INV2 may include a PMOS transistor and an NMOS transistor coupled between a source voltage (VDD) terminal and a ground voltage (VSS) terminal. The first option setting signal OPT<k:0> and the second option setting signal OPR<m:0> may include a ratio of width to length (W/L) of the transistor, the drivability ratio of PMOS to NMOS transistor, a bias voltage, a gate capacitance, and so on.

Figure 4:
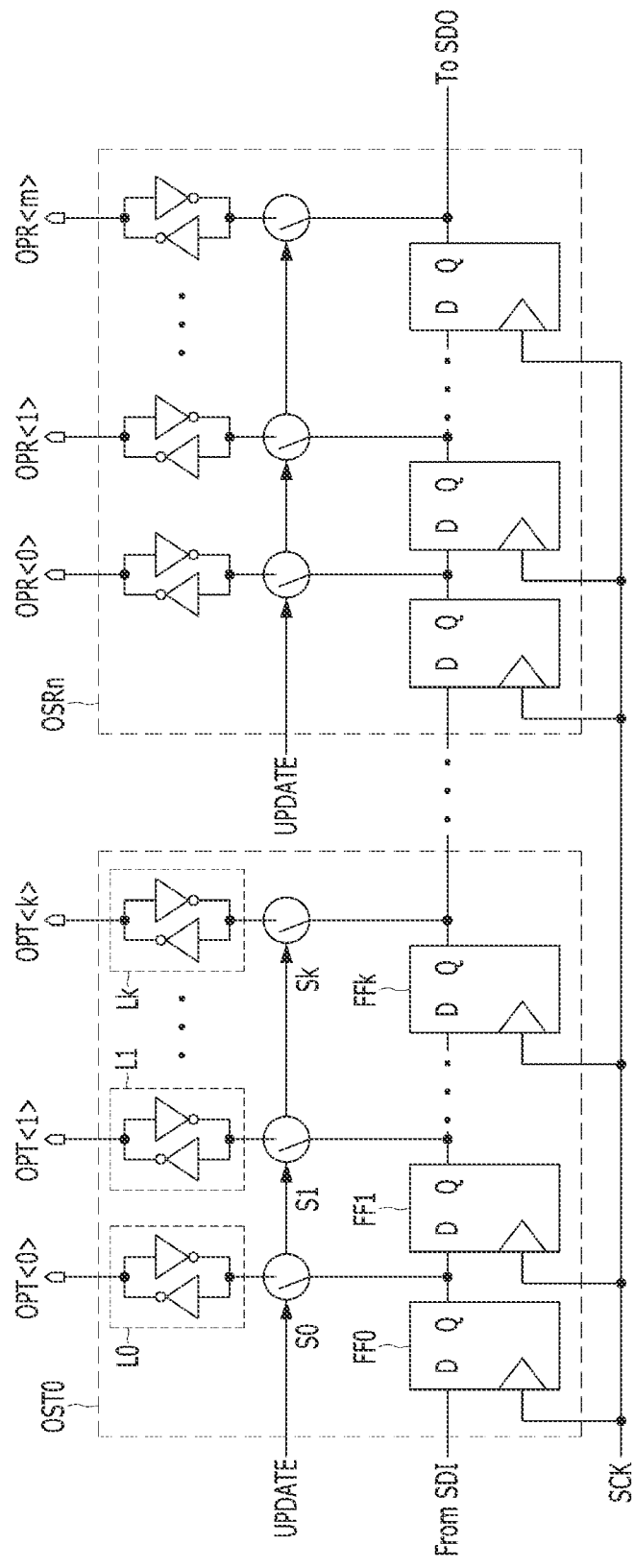
FIG. 4 is a circuit diagram illustrating the option setting circuits of FIG. 3.

FIG. 4 is a circuit diagram illustrating the option setting circuits 120_0 to 120_*n* of FIG. 3.

Referring to FIG. 4, each of the first option setting parts OST0 to OSTn and the second option setting parts OSR0 to OSRn may include a plurality of flip-flops, a plurality of latches, and a plurality of switches.

For example, the first option setting part OST0 may include a plurality of flip-flops FF0 to FFk, a plurality of latches L0 to Lk, and a plurality of switches S0 to Sk. The flip-flops FF0 to FFk may respectively correspond to bits of the first option setting signal OPT<k:0>, i.e., the flip-flops FF0 to FFk may be equipped with the number corresponding to the bit number of the first option setting signal OPT<k:0>. The flip-flops FF0 to FFk may be coupled in series, and sequentially transfer a serial signal inputted through the serial input pad SDI, according to a serial clock SCLK. Finally, the first option setting part OST0 may transfer the serial signal to an option setting part at the next stage, i.e., the second option setting part OSR0, through the serial chain SC. The latches L0 to Lk may respectively correspond to the flip-flops FF0 to FFk, and store the respective bits of the first option setting signal OPT<k:0>. The switches S0 to Sk may be respectively coupled between the flip-flops FF0 to FFk and the latches L0 to Lk, turned on according to an update signal UPDATE, and transfer outputs of the flip-flops FF0 to FFk to the latches LU to Lk. The signals transferred to the latches LU to Lk may be stored as the first option setting signal OPT<k:0>.

An operation of the option setting circuits 120_0 to 120_*n* of FIG. 4 will be explained as follows.

Whenever the serial dock signal SCLK toggles, the serial signal inputted from the serial input pad SDI is sequentially stored in the flip-flops of each option setting part, through the serial chain SC. After target values are stored in all of the flip-flops, the switches are turned on accordingly as the update signal UPDATE is enabled. The outputs of the flip-flops are transferred and stored in the latches, as the first option setting signal OPT<k:0> and the second option setting signal OPR<m:0>. The first option setting signal OPT<k:0> and the second option setting signal OPR<m:0> stored in the latches are provided to the input buffers RX0 to RXn and the output buffers TX0 to TXn, so as to be used to set the options of each of the input/output buffers.

As described above, in accordance with the embodiment, the serial input pad SDI, the option setting circuits 120_0 to 120_*n*, and the serial output pad SDO may configure the serial chain SC. Thus, the serial signal inputted from the serial input pad SDI is sequentially stored in the option setting parts OST0 to OSTn and OSR0 to OSRn, using the serial chain SC, and the stored values are used as the option setting signals OPT<k:U> and OPR<m:0> to set the options of the input/output buffers. Furthermore, the option setting signals OPT k:0> and OPR<m:0> stored in the option setting parts OST0 to OSTn and OSR0 to OSRn are outputted to the serial output pad SDO, using the serial chain SC, and thus, it is possible to check/verify whether the options are properly set, based on the serial signal outputted through the serial output pad SDO.

Figure 5:
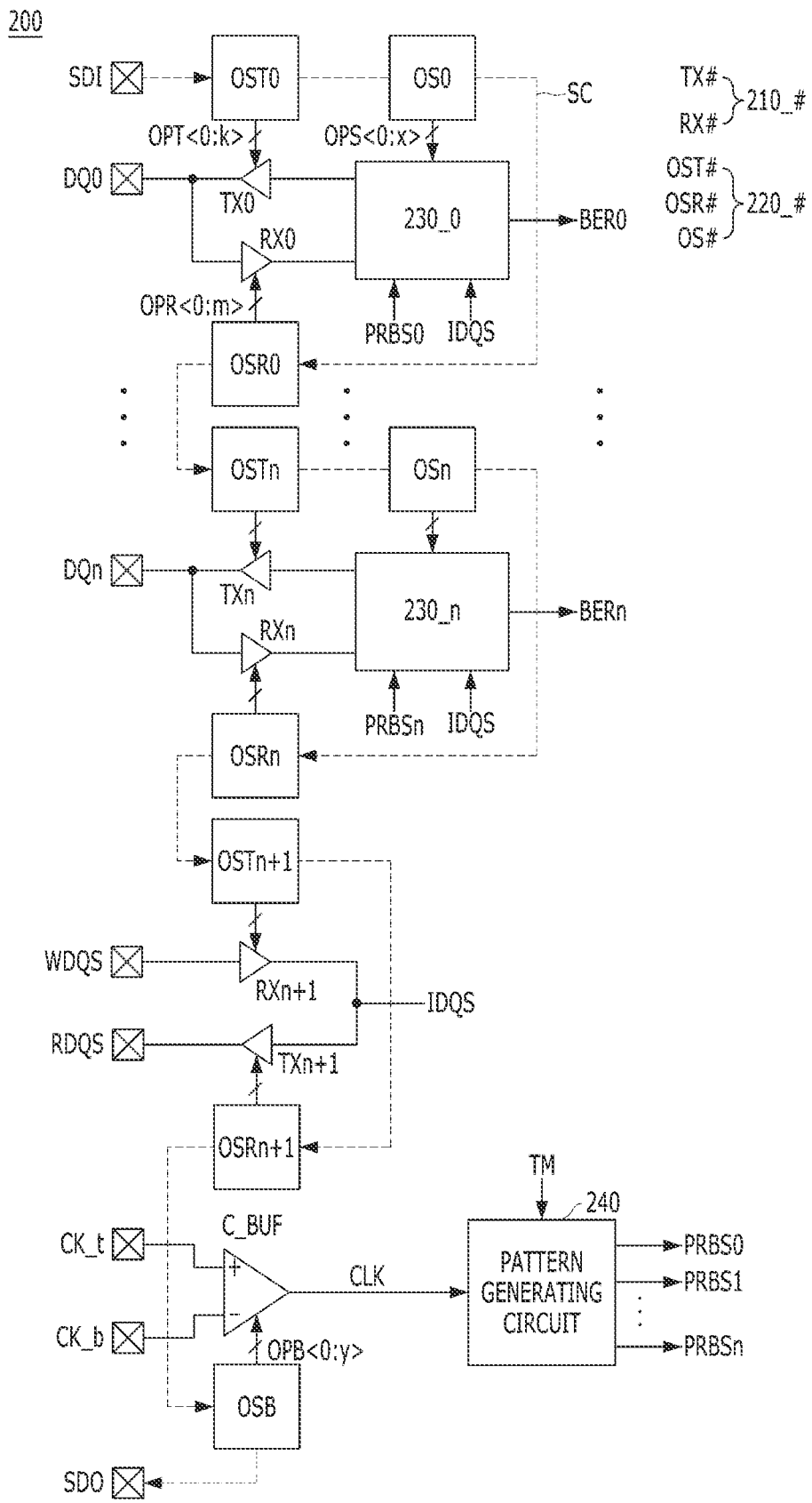
FIG. 5 is a configuration diagram illustrating a semiconductor device including option setting circuits in accordance with an embodiment of the present invention.

FIG. 5 is a configuration diagram illustrating a semiconductor device 200 including option setting circuits in accordance with an embodiment of the present invention.

Referring to FIG. 5, the semiconductor device 200 may include a plurality of data pads DQ0 to DQn, a write strobe pad WDQS, a read strobe pad RDQS, differential clock pads CK_t and CK_b, a serial input pad SDI, a serial output pad SDO, a plurality of interface circuits 210_0 to 210_n+1 and C_BUF, a plurality of option setting circuits 220_0 to 220_n+1 and OSB, a plurality of path control circuits 230_0 to 230_n, and a pattern generating circuit 240.

The interface circuits 210_0 to 210_n+1 and C_BUF may respectively correspond to the data pads DQ0 to DQn, the write strobe pad WDQS, the read strobe pad RDQS, and the differential dock pads CK_t and CK_b. The interface circuits 210_0 to 210_n+1 and C_BUF may include a plurality of output buffers TX0 to TXn+1, a plurality of input buffers RX0 to RXn+1, and a dock buffer C_BUF, Each 210_# (# being an integer from 0 to n+1) of the interface circuits 210_0 to 210_n+1 may include an output buffer TX # for outputting a signal to a corresponding pad, and an input buffer RX # for receiving a signal from the corresponding pad. Further, the interface circuit C_BUF may include a clock buffer C_BUF for receiving differential clock signals inputted through the differential clock pads.

The option setting circuits 220_0 to 220_n+1 and OSB may respectively correspond to the interface circuits 210_0 to 210_n+1 and C_BUF and the path control circuits 230_0 to 230_n, to set options of the respective interface circuits. Each 220_# of the option setting circuits 220_0 to 220_n+1 and OSB may include a first option setting part OST # for setting an option of a corresponding output buffer TX #, a second option setting part OSR # for setting an option of a corresponding input buffer RX #, a third option setting part OS # for setting an option of a corresponding path control circuit 230_#, and a fourth option setting part OSB for setting an option of the clock buffer C_BUF. Depending on an embodiment, the fourth option setting part OSB may be omitted.

The first option setting parts OST0 to OSTn+1 may respectively correspond to the output buffers TX0 to TXn+1. Each of the first option setting parts OST0 to OSTn+1 may provide a first option setting signal OPT<k:0> for setting an option of a correspond output buffer. The second option setting parts OSR0 to OSRn+1 may respectively correspond to the input buffers RX0 to RXn+1, Each of the second option setting parts OSR0 to OSRn+1 may provide a second option setting signal OPR<m:0> for setting an option of a correspond input buffer. The third option setting parts OS0 to OSn may respectively correspond to the path control circuits 230_0 to 230_n. Each of the third option setting parts OS0 to OSn may provide a third option setting signal OPS<x:0> for setting an option of a correspond path control circuit. The fourth option setting part OSB may provide a fourth option setting signal OPB<y:0> for setting an option of a correspond dock buffer C_BUF.

In an embodiment, the serial input pad SDI, the option setting circuits 220_0 to 220_n+1 and OSB, and the serial output pad SDO may configure a serial chain SC. The serial chain SC may be configured between the serial input pad SDI and the serial output pad SDO, in a sequence from the first option setting part OST # to the second option setting part OSR # through the third option setting part OS # in each of the option setting circuits 220_0 to 220_n+1. Further, the serial chain SC may be configured in a sequence from the second option setting part OSR_n+1 of the option setting circuit 220_n+1 at the last stage, to the serial output pad SDO through the fourth option setting part OSB. Depending on an embodiment, the serial chain SC may be configured by placing the option setting parts of the option setting circuits 220_0 to 220_n+1 in various order. The serial chain SC may be configured in substantially the same way as the serial chain SC of FIGS. 3 and 4.

The pattern generating circuit 240 may generate a random test pattern PRBS<n:0> of multi-bit according to an internal clock signal CLK and a preset mode signal (e.g., a test mode signal TM). The bit number of the random test pattern PRBS<n:0> may correspond to the number of the path control circuits 230_0 to 230_n. When the test mode signal TM is enabled, the pattern generating circuit 240 may generate an independent random test pattern PRBS<n:0> according to the internal clock signal CLK. The pattern generating circuit 240 may be implemented with a pattern generating polynomial circuit such as a pseudo random bit stream or sequences (PRBS) generator. Each bit of the test pattern PRBS<n:0> generated by the pattern generating circuit 240 may be independently provided to each of the path control circuits 230_0 to 230_n.

The path control circuits 230_0 to 230_n may respectively correspond to the interface circuits 210_0 to 210_n and the data pads DQ0 to DQn. During a read operation, the path control circuits 230_0 to 230_n may output the test pattern PRBS<n:0> provided from the pattern generating circuit 240, to the data pads DQ0 to DQn through the output buffers TX0 to TXn, During a write operation, the path control circuits 230_0 to 230_n may generate a plurality of comparison signals BER0 to BERn by respectively comparing the test pattern PRBS<n:0> provided from the pattern generating circuit 240 with data inputted from the data pads DQ0 to DQn through the input buffers RX0 to RXn. The comparison signals BER0 to BERn may be provided to an internal logic, thereby checking a bit error occurring during a data transfer operation. The path control circuits 230_0 to 230_n may operate in synchronization with a strobe signal IDQS.

As described above, in accordance with the embodiment, the serial input pad SDI, the option setting circuits 220_0 to 220_n+1 and OSB, and the serial output pad SDO may configure the serial chain SC. Thus, a serial signal inputted from the serial input pad SDI is sequentially stored in the option setting parts OST0 to OSTn+1, OSR0 to OSRn+1, OS0 to OSn, and OSB, using the serial chain SC, and the stored values are used as the option setting signals OPT<k:0>, OPR<m:0>, OPS<x:0> and OPB<y:0> to set the options of the input/output buffers and the path control circuits. Furthermore, the option setting signals OPT<k:0>, OPR<m:0>, OPS<x:0> and OPB<y:0> stored in the option setting parts OST0 to OSTn+1, OSR0 to OSRn+1, OS0 to OSn, and OSB are outputted to the serial output pad SDO, using the serial chain SC. Thus, it is possible to check/verify whether the options are properly set, based on the serial signal outputted through the serial output pad SDO.

Hereinafter, referring to FIGS. 6 to 8, a detailed configuration of the path control circuits 230_0 to 230_n will be explained. Since the path control circuits 230_0 to 230_n have substantially the same configuration, the first path control circuit 230_0 will be explained as an example.

Figure 6:
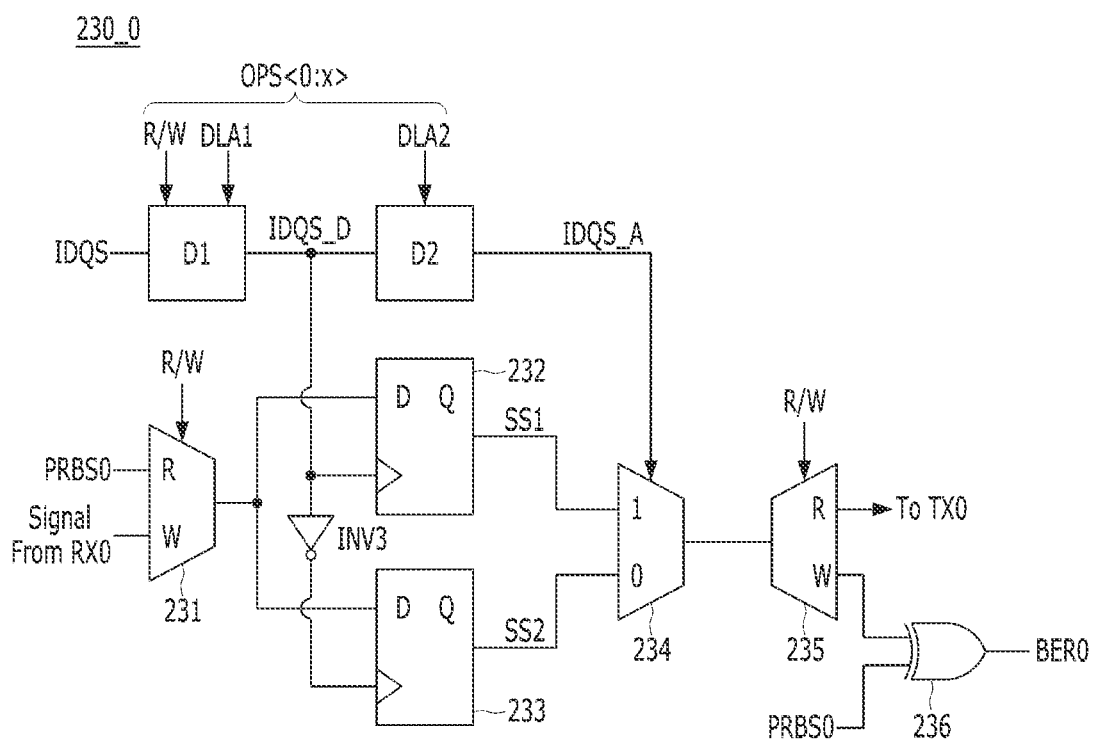
FIG. 6 is a circuit diagram illustrating a first path control circuit of FIG. 5.

FIG. 6 is a circuit diagram illustrating the first path control circuit 230_0 of FIG. 5.

Referring to FIG. 6, the first path control circuit 230_0 may include a first multiplexer 231, a first delay element D1, a second delay element D2, a first flip-flop 232, a second flip-flop 233, a second multiplexer 234, a demultiplexer 235, and an error detector 236.

The first multiplexer 231 may select one of the test pattern PRBS0 and a signal transferred from the input buffer RX0 according to a read/write signal R/W, The first multiplexer 231 may select the test pattern PRBS0 when the read signal R is enabled, and may select the signal transferred from the data pad DQ0 through the input buffer RX0 when the write signal w is enabled.

The first delay element D1 may delay the strobe signal IDQS by different delay amounts depending on the read/write signal R/W and a first compensation signal DLA1, to output a delayed strobe signal IDQS_D. For example, there is a phase difference of ¼ clock period (i.e., a phase difference of 90 degree) between the strobe signal IDQS during the read operation and the strobe signal IDQS during the write operation. At this time, the first delay element D1 may adjust the delay amount corresponding to the first compensation signal DLA1 according to the read signal R or the write signal W.

The second delay element D2 may delay the delayed strobe signal IDQS_D by a delay amount corresponding to a second compensation signal DLA2, to output an aligned strobe signal IDQS_A. The second compensation signal DLA2 may have information on a delay amount required by the first flip-flop 232 and the second flip-flop 233, That is, the second delay element D2 may delay the delayed strobe signal IDQS_D such that the delay amount required by the first flip-flop 232 and the second flip-flop 233 is reflected onto the delayed strobe signal IDQS_D, to thereby output the aligned strobe signal IDQS_A. For reference, the read/write signal R/W, the first compensation signal DLA1, and the second compensation signal DLA2 may be set by the third option setting signal OPS<x:0>, That is, the third option setting parts OS0 to OSn may provide the read/write signal R/W, the first compensation signal DLA1, and the second compensation signal DLA2 in the form of the third option setting signal OPS<x:0>.

The first flip-flop 232 may store an output of the first multiplexer 231 to output a first intermediate signal SS1 according to the delayed strobe signal IDQS_D. The second flip-flop 233 may store the output of the first multiplexer 231 to output a second intermediate signal 552 according to an inverted signal of the delayed strobe signal IDQS_D. That is, the first flip-flop 232 may store the output of the first multiplexer 231 in response to a rising edge of the delayed strobe signal IDQS_D, and the second flip-flop 233 may store the output of the first multiplexer 231 in response to a falling edge of the delayed strobe signal IDQS_D. Depending on an embodiment, an inverter INV3 may be further provided to invert the delayed strobe signal IDQS_D.

The second multiplexer 234 may select one of the first intermediate signal 551 and the second intermediate signal 552 according to the aligned strobe signal IDQS_A. The second multiplexer 234 may select the first intermediate signal 551 during an activation period of the aligned strobe signal IDQS_A, and select the second intermediate signal SS2 during a deactivation period of the aligned strobe signal IDQS_A.

The demultiplexer 235 may output an output of the second multiplexer 234 to the data pad DQ0 through the output buffer TX0, or to the error detector 236, according to the read/write signal R/W. The demultiplexer 235 may output the output of the second multiplexer 234 to the output buffer TX0 when the read signal R is enabled, and output the output of the second multiplexer 234 to the error detector 236 when the write signal W is enabled.

The error detector 236 may generate the comparison signal BER0 by comparing the test pattern PRBS0 with an output of the demultiplexer 235. The error detector 236 may be implemented with an exclusive OR gate. The error detector 236 may output the comparison signal BER0 of a logic low level when the test pattern PRBS0 is identical to the output of the demultiplexer 235, and output the comparison signal BER0 of a logic high level when the test pattern PRBS0 is different from the output of the demultiplexer 235.

Hereinafter, referring to FIGS. 7 and 8, a detailed configuration of the first path control circuit 230_0 will be explained.

Figure 7:
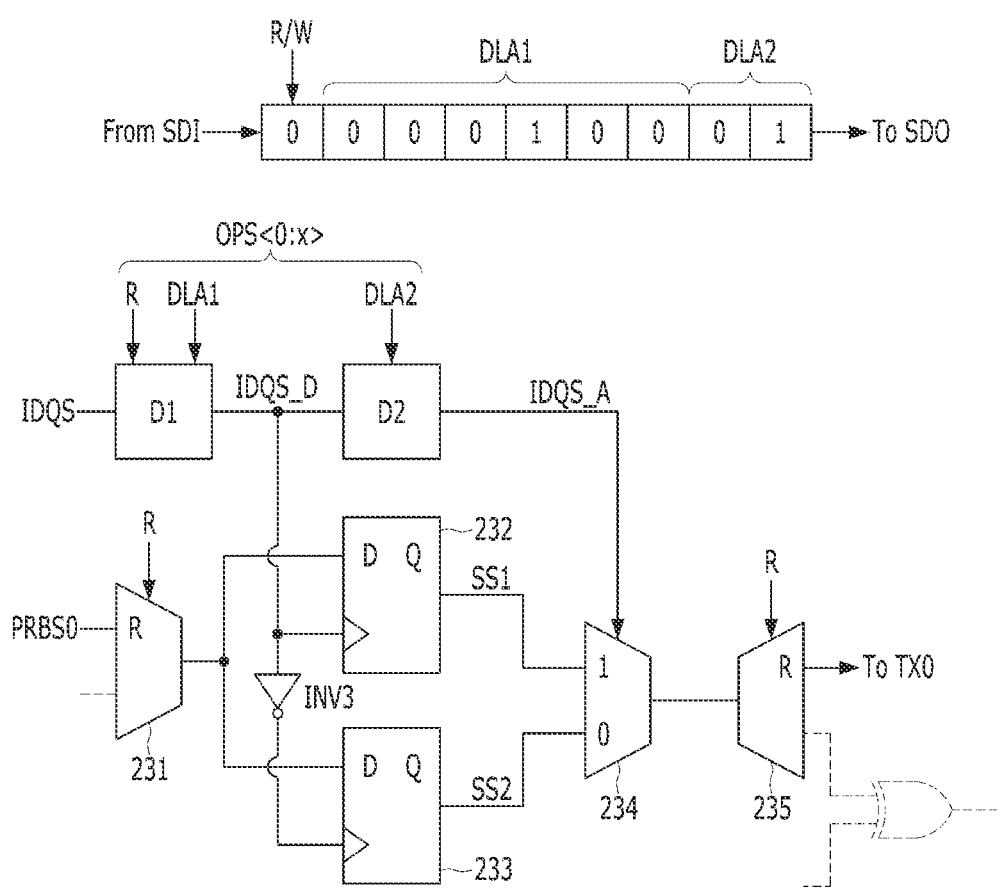
FIG. 7 is a diagram illustrating a read operation of the first path control circuit of FIG. 6.

FIG. 7 is a diagram illustrating a read operation of the first path control circuit 230_0 of FIG. 6.

Referring to FIG. 7, the serial signal inputted from the serial input pad SDI is sequentially stored in the third option setting parts OS0 to OSn, using the serial chain SC. The third option setting parts OS0 to OSn may provide the third option setting signal OPS<x:0> for setting the option of the correspond path control circuit. The third option setting signal OPS<x:0> may include the read/write signal R/W, the first compensation signal DLA1, and the second compensation signal DLA2. It is assumed that the read/write signal R/W, the first compensation signal DLA1, and the second compensation signal DLA2 are respectively set to "0", "000100" and "01", During the read operation, the read/write signal R/W is set to "0", and thus the read signal R is enabled to a logic high level.

The first delay element D1 may delay the strobe signal IDQS by a delay amount while adjusting the delay amount corresponding to the first compensation signal DLA1, according to the read signal R. The second delay element D2 may delay the delayed strobe signal IDQS_D by a delay amount corresponding to the second compensation signal DLA2, to output the aligned strobe signal IDQS_A.

The first multiplexer 231 may select the test pattern PRBS0 when the read signal R is enabled. The first flip-flop 232 may store the output of the first multiplexer 231 in response to the rising edge of the delayed strobe signal IDQS_D. The second flip-flop 233 may store the output of the first multiplexer 231 in response to the falling edge of the delayed strobe signal IDQS_D.

The second multiplexer 234 may alternatively output the first intermediate signal 551 and the second intermediate signal 552 according to the aligned strobe signal IDQS_A. The demultiplexer 235 may output the output of the second multiplexer 234 to the output buffer TX0. Finally, the output buffer TX0 may output the output of the second multiplexer 234 to an external device through the data pad DQ0.

As described above, during the read operation, the path control circuits 230_0 to 230_n may output the test pattern PRBS<n:0> provided from the pattern generating circuit 240, to the external device through the data pads DQ0 to DQn.

Figure 8:
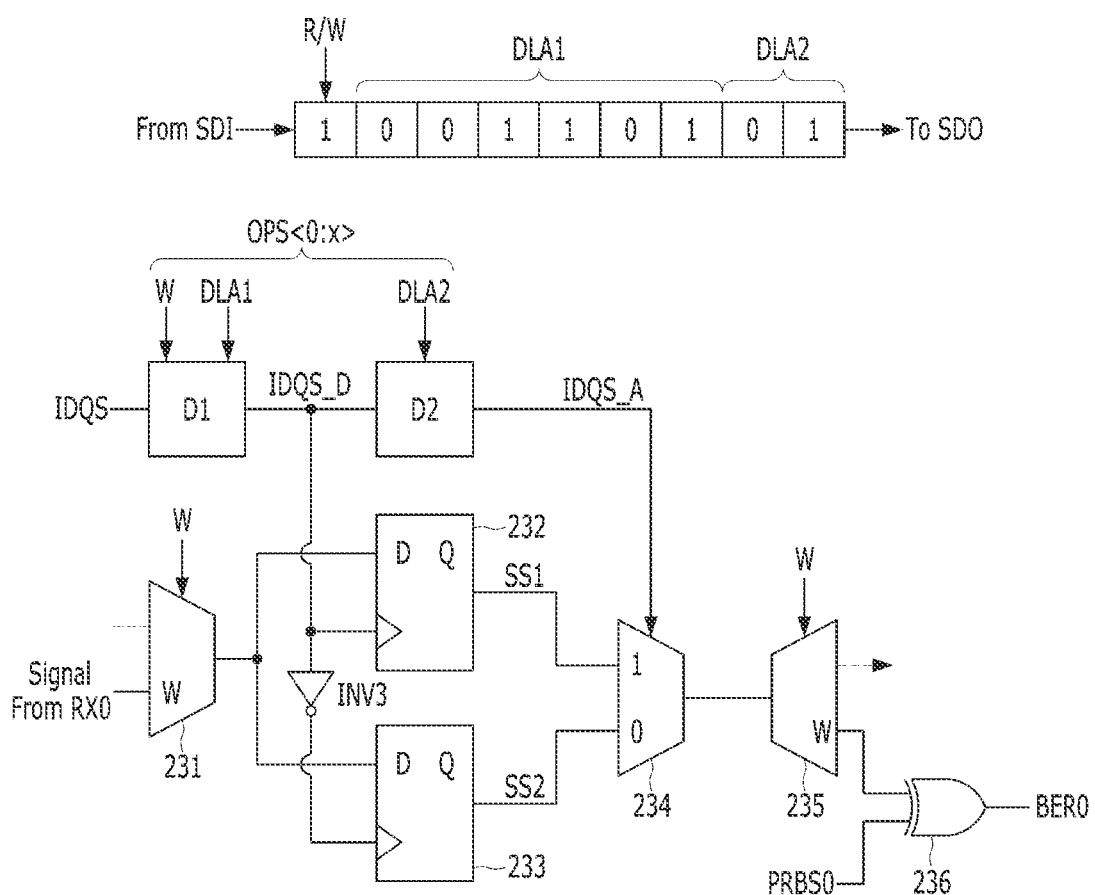
FIG. 8 is a diagram illustrating a write operation of the first path control circuit of FIG. 6.

FIG. 8 is a diagram illustrating a write operation of the first path control circuit 230_0 of FIG. 5.

Referring to FIG. 8, it is assumed that the read/write signal R/W, the first compensation signal DLA1, and the second compensation signal DLA2 are respectively set to "1", "001101" and "01". During the write operation, the read/write signal R/W is set to "1", and thus the write signal W is enabled to a logic high level.

The first delay element D1 may delay the strobe signal IDQS by a delay amount while adjusting the delay amount corresponding to the first compensation signal DLA1, according to the write signal W. The second delay element D2 may delay the delayed strobe signal IDQS_D by a delay amount corresponding to the second compensation signal DLA2, to output the aligned strobe signal IDQS_A.

The first multiplexer 231 may the signal transferred from the data pad DQ0 through the input buffer RX0 when the write signal W is enabled. The first flip-flop 232 may store the output of the first multiplexer 231 in response to the rising edge of the delayed strobe signal IDQS_D. The second flip-flop 233 may store the output of the first multiplexer 231 in response to the falling edge of the delayed strobe signal IDQS_D.

The second multiplexer 234 may alternatively output the first intermediate signal SS1 and the second intermediate signal SS2 according to the aligned strobe signal IDQS_A. The demultiplexer 235 may output the output of the second multiplexer 234 to the error detector 236, The error detector 236 may output the comparison signal BER0 of a logic low level when the test pattern PRBS0 is identical to the output of the demultiplexer 235. The error detector 236 may output the comparison signal BER0 of a logic high level when the test pattern PRBS0 is different from the output of the demultiplexer 235.

As described above, during the write operation, the path control circuits 230_0 to 230_n may generate the comparison signals BER0 to BERn by respectively comparing the test pattern PRBS<n:0> provided from the pattern generating circuit 240 with the data inputted from the data pads DQ0 to DQn. The comparison signals BER0 to BERn may be provided to an internal logic, thereby checking a bit error occurring during a data transfer operation.

Meanwhile, although it is explained that the comparison signals BER0 to BERn are provided to the internal logic, the present invention is not limited thereto. Depending on an embodiment, the comparison signals BER0 to BERn may be outputted to the external device, by using the serial chain.

Figure 9:
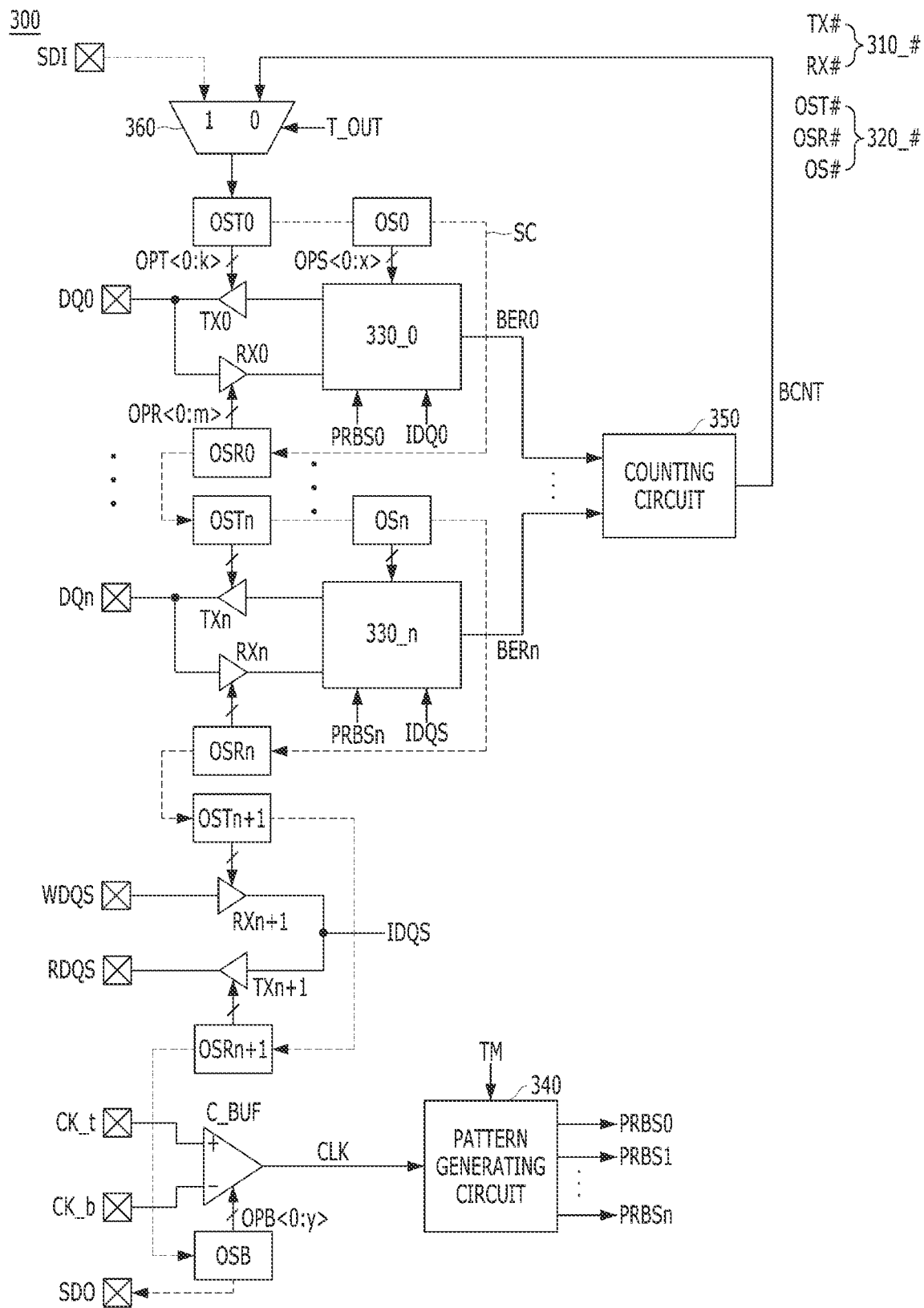
FIG. 9 is a configuration diagram illustrating a semiconductor device including option setting circuits in accordance with an embodiment of the present invention.

FIG. 9 is a configuration diagram illustrating a semiconductor device 300 including an option setting circuit in accordance with an embodiment of the present invention.

Referring to FIG. 9, the semiconductor memory 300 may include a plurality of data pads DQ0 to DQn, a write strobe pad WDQS, a read strobe pad RDQS, differential clock pads CK_t and CK_b, a serial input pad SDI, a serial output pad SDO, a plurality of interface circuits 310_0 to 310_n+1 and C_BUF, a plurality of option setting circuits 320_0 to 320_n+1 and OSB, a plurality of path control circuits 330_0 to 330_n, a pattern generating circuit 340, a counting circuit 350, and a selection circuit 360.

The data pads DQ0 to DQn, the write strobe pad WDQS, the read strobe pad RDQS, the differential clock pads CK_t and CK_b, the serial input pad SDI, the serial output pad SDO, the interface circuits 310_0 to 310_n+1 and C_BUF, the option setting circuits 320_0 to 320_n+1 and OSB, and the path control circuits 330_0 to 330_n of FIG. 9 may have substantially the same configuration as those of FIG. 5.

The counting circuit 350 may generate an error count signal BCNT by counting a plurality of comparison signals BER0 to BERn provided from the path control circuits 330_0 to 330_n. The counting circuit 350 may count the number of signals of a logic high level among the comparison signals BER0 to BERn, thereby checking a case where an error occurs since a test pattern PRBS<n:0> are different from data transferred from the data pads DQ0 to DQn.

The selection circuit 360 may select one of the error count signal BCNT and a signal inputted from the serial input pad SDI according to a test output signal T_OUT, to transfer a selected signal to a serial chain SC. When the test output signal T_OUT is enabled, the selection circuit 360 may select the error count signal BCNT and transfer the selected signal to the serial chain SC. Thus, the error count signal BCNT may be outputted to an external device through the serial output pad SDO, by using the serial chain SC, FIG. 10 is a configuration diagram illustrating a semiconductor system 400 in accordance with an embodiment of the present invention.

Figure 10:
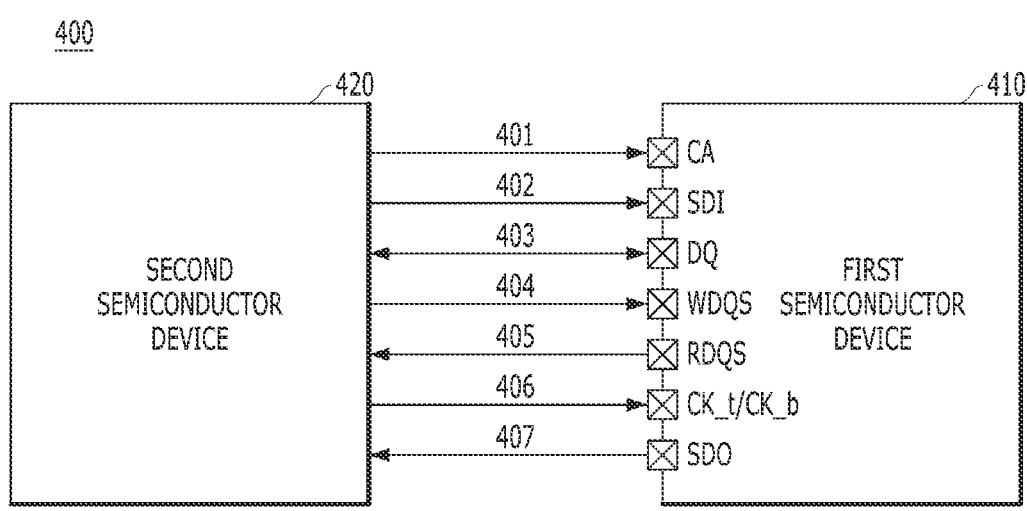
FIG. 10 is a configuration diagram illustrating a semiconductor system in accordance with an embodiment of the present invention.

Referring to FIG. 10, the semiconductor system 400 may include a first semiconductor device 410 and a second semiconductor device 420.

The first semiconductor device 410 may be implemented with any of the semiconductor devices 100 to 300 of FIGS. 3 to 9. For example, the first semiconductor device 410 may include a plurality of command/address pads CA, a serial input pad SDI, a plurality of data pads DQ, a write strobe pad WDQS, a read strobe pad RDQS, differential dock pads CK_t and CK_b, and a serial output pad SDO. The first semiconductor device 410 may receive a command/address 401 through the command/address pads CA, and receive option information 402 through the serial input pad SDI. The first semiconductor device 410 may receive or output data 403 through the plurality of data pads DQ, receive a write strobe signal 404 through the write strobe pad WDQS, and output a read write strobe signal 405 through the read strobe pad RDQS. The first semiconductor device 410 may receive differential dock signals 406 through the differential clock pads CK_t and CK_b, and output set option information 407 through the serial output pad SDO.

Furthermore, the first semiconductor device 410 may include a plurality of interface circuits and a plurality of option setting circuits. The interface circuits may respectively correspond to the data pads DQ. The option setting circuits may respectively correspond to the interface circuits, to set options of the respective interface circuits. At this time, the serial input pad SDI, the option setting circuits, and the serial output pad SDO may configure a serial chain. The first semiconductor device 410 may sequentially store the option information 402 inputted through the serial input pad SDI, into the option setting circuits, by using the serial chain. The first semiconductor device 410 may sequentially output the set option information 407 in the option setting circuits, to the serial output pad SDO, by using the serial chain.

The second semiconductor device 420 may sequentially transfer the option information 402 to the first semiconductor device 410 through the serial input pad SDI, and monitor the set option information 407 that is provided from the first semiconductor device 410 through the serial output pad SDO. Depending on an embodiment, the second semiconductor device 420 may include a controller for controlling the first semiconductor device 410, or a test device for testing the first semiconductor device 410.

As described above, in accordance with the embodiment of the present invention, the semiconductor device may generate the test pattern internally without receiving an additional test pattern from the external device, and output the test pattern to the outside through the data pads, or check/verify whether an error occurs by comparing the test pattern with the data inputted through the data pads. Further, it is possible to determine an error rate by outputting the check result using the serial chain, thereby improving the reliability of the test operation and the test performance of the semiconductor device.

It should be noted that although the technical spirit of the disclosure has been described in connection with preferred embodiments thereof, this is merely for description purposes and should not be interpreted as limiting. It should be appreciated by one of ordinary skill in the art that various changes may be made thereto without departing from the technical spirit of the disclosure.

For example, for the logic gates and transistors provided as examples in the above-described embodiments, different positions and kinds may be implemented depending on the polarity of the input signal.

What is claimed is:

1. A semiconductor device, comprising:
a plurality of input/output (I/O) pads;
a serial input pad;
a serial output pad;
a plurality of interface circuits respectively corresponding to the I/O pads; and
a plurality of option setting circuits respectively corresponding to the interface circuits, suitable for setting options of the respective interface circuits,
wherein the serial input pad, the option setting circuits, and the serial output pad configure a serial chain.

2. The semiconductor device of claim 1, wherein a serial signal inputted to the serial input pad is sequentially stored in the option setting circuits, through the serial chain.

3. The semiconductor device of claim 2, wherein values stored in the option setting circuits are sequentially outputted to the serial output pad, through the serial chain.

4. The semiconductor device of claim 1, wherein each of the interface circuits includes:
an output buffer suitable for outputting a signal to a corresponding I/O pad; and
an input buffer suitable for receiving a signal from the corresponding I/O pad.

5. The semiconductor device of claim 4, wherein each of the option setting circuits includes:
a first option setting part suitable for setting one or more options of a corresponding output buffer; and
a second option setting part suitable for setting one or more options of a corresponding input buffer.

6. The semiconductor device of claim 5, wherein the serial chain is configured between the serial input pad and the serial output pad, in a sequence from the first option setting part to the second option setting part in each of the option setting circuits.

7. The semiconductor device of claim 1, wherein each of the option setting circuits includes:
a plurality of flip-flops coupled in series, and suitable for sequentially transferring a serial signal inputted through the serial input pad, according to a serial clock;
a plurality of latches respectively corresponding to the flip-flops; and
a plurality of switches respectively coupled between the flip-flops and the latches, and suitable for transferring outputs of the flip-flops to the latches according to an update signal.

8. A semiconductor device, comprising:
a plurality of input/output (I/O) pads;
a serial input pad;
a serial output pad;
a pattern generating circuit suitable for generating a test pattern according to a clock signal;
a plurality of input buffers and a plurality of output buffers respectively corresponding to the I/O pads;
a plurality of path control circuits respectively corresponding to the I/O pads, suitable for outputting the test pattern to the output buffers during a read operation, and for generating a plurality of comparison signals by comparing the test pattern with data inputted from the I/O pads during a write operation; and
a plurality of option setting circuits respectively corresponding to the input buffers, the output buffers, and the path control circuits, to set options thereof,
wherein the serial input pad, the option setting circuits, and the serial output pad configure a serial chain.

9. The semiconductor device of claim 8, wherein each of the option setting circuits includes:
a first option setting part suitable for setting an option of a corresponding output buffer; and
a second option setting part suitable for setting one or more options of a corresponding input buffer; and
a third option setting part suitable for setting one or more options of a corresponding path control circuit.

10. The semiconductor device of claim 9, wherein the serial chain is configured between the serial input pad and the serial output pad, in a sequence from the first option setting part to the second option setting part through the third option setting part in each of the option setting circuits.

11. The semiconductor device of claim 8, wherein each of the option setting circuits includes:
a plurality of flip-flops coupled in series, suitable for sequentially transferring a serial signal inputted through the serial input pad, according to a serial clock;
a plurality of latches respectively corresponding to the flip-flops; and
a plurality of switches respectively coupled between the flip-flops and the latches, suitable for transferring outputs of the flip-flops to the latches according to an update signal.

12. The semiconductor device of claim 8, wherein the pattern generating circuit includes a pseudo random bit stream or sequences (PRBS) generator.

13. The semiconductor device of claim 8, wherein each of the path control circuits includes:
a first multiplexer suitable for selecting one of the test pattern and a signal transferred from the input buffer according to a read/write signal;
first and second flip-flops suitable for storing an output of the first multiplexer in response to rising and falling edges of a delayed strobe signal;
a second multiplexer suitable for selecting one of outputs of the first and second flip-flops according to an aligned strobe signal;
a demultiplexer suitable for outputting an output of the second multiplexer to the output buffer, or to an error detector, according to the read/write signal; and
the error detector suitable for generating a corresponding comparison signal by comparing the test pattern with an output of the demultiplexer.

14. The semiconductor device of claim 13, wherein each of the path control circuits further includes:
a first delay element suitable for delaying a strobe signal by different delay amounts depending on the read/write signal and a first compensation signal, to output the delayed strobe signal; and
a second delay element suitable for delaying the delayed strobe signal by a delay amount corresponding to a second compensation signal, to output the aligned strobe signal,
wherein the first and second compensation signals are set by the option setting circuits.

15. The semiconductor device of claim 8, further comprising:
a counting circuit suitable for generating an error count signal by counting the comparison signals; and a selection circuit suitable for selecting one of the error count signal and a signal inputted from the serial input pad, to transfer a selected signal to the serial chain.

16. A semiconductor system, comprising:
a first semiconductor device including a plurality of input/output (I/O) pads, a serial input pad and a serial output pad; and
a second semiconductor device suitable for sequentially transferring option information to the first semiconductor device through the serial input pad, and for monitoring set option information that are provided from the first semiconductor device through the serial output pad,
wherein the first semiconductor device includes:
a plurality of interface circuits respectively corresponding to the I/O pads; and
a plurality of option setting circuits respectively corresponding to the interface circuits, suitable for setting options of the respective interface circuits,
wherein the serial input pad, the option setting circuits, and the serial output pad configure a serial chain.

17. The semiconductor system of claim 16,
wherein the first semiconductor device sequentially stores the option information inputted to the serial input pad into the option setting circuits, by using the serial chain, and
wherein the first semiconductor device sequentially outputs the set option information in the option setting circuits, to the serial output pad, by using the serial chain.

18. The semiconductor system of claim 16, wherein each of the option setting circuits includes:
a first option setting part suitable for setting one or more options of a corresponding output buffer; and
a second option setting part suitable for setting one or more options of a corresponding input buffer.

19. The semiconductor system of claim 16, wherein the serial chain is configured between the serial input pad and the serial output pad, in a sequence from the first option setting part to the second option setting part in each of the option setting circuits.

20. The semiconductor system of claim 16, wherein each of the option setting circuits includes:
a plurality of flip-flops coupled in series, suitable for sequentially transferring a serial signal inputted through the serial input pad, according to a serial clock;
a plurality of latches respectively corresponding to the flip-flops; and
a plurality of switches respectively coupled between the flip-flops and the latches, suitable for transferring outputs of the flip-flops to the latches according to an update signal.

21. A semiconductor device comprising:
a serial input pad;
a serial output pad;
a plurality of data pads;
a plurality of interface circuits respectively corresponding to the data pads, each interface circuit including an input buffer and an output buffer which are coupled in parallel to a corresponding data pad among the data pads;
an internal circuit including a plurality of memory cells;
a plurality of path control circuits respectively corresponding to the interface circuits, each path control circuit coupled between the internal circuit and a corresponding interface circuit among the interface circuits; and
a plurality of option setting circuits respectively corresponding to the interface circuits, suitable for setting options of the respective interface circuits and the respective path control circuits, each option setting circuit at least coupled between the serial input pad and a corresponding interface circuit, between the corresponding interface circuit and an adjacent interface circuit to the corresponding interface circuit and between the corresponding interface circuit and the serial output pad,
wherein the serial input pad, the option setting circuits, and the serial output pad configure a serial chain.

* * * * *